US010453713B2

(12) United States Patent
Cho et al.

(10) Patent No.: US 10,453,713 B2
(45) Date of Patent: Oct. 22, 2019

(54) METHOD FOR CONTROLLING TEMPERATURE OF FURNACE IN SEMICONDUCTOR FABRICATION PROCESS

(71) Applicant: Taiwan Semiconductor Manufacturing Co., Ltd., Hsinchu (TW)

(72) Inventors: Kuei-Hsiung Cho, Xinpu Township, Hsinchu County (TW); Shun-Chao Yang, Taichung (TW); Ching-Wen Cheng, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/363,260

(22) Filed: Nov. 29, 2016

(65) Prior Publication Data

US 2018/0151397 A1 May 31, 2018

(51) Int. Cl.
*H01L 21/67* (2006.01)
*H01L 21/02* (2006.01)

(52) U.S. Cl.
CPC .. *H01L 21/67109* (2013.01); *H01L 21/02238* (2013.01); *H01L 21/67126* (2013.01); *H01L 21/02255* (2013.01); *H01L 21/67098* (2013.01)

(58) Field of Classification Search
CPC ......... H01L 21/67109; H01L 21/02238; H01L 21/67098; H01L 21/67126
USPC ........ 432/241, 242, 247, 249, 253; 118/725; 438/431, 770
See application file for complete search history.

(56) References Cited

U.S. PATENT DOCUMENTS 5,753,046 A * 5/1998 Choi ........................ C30B 31/00 118/715
5,938,852 A * 8/1999 Nam ........................ C23C 16/46 118/724
6,573,198 B2 * 6/2003 Boonstra ........... H01L 21/67303 211/41.18
8,216,767 B2 7/2012 Wang et al.
8,323,870 B2 12/2012 Lee et al.
8,580,117 B2 11/2013 Kao et al.
8,658,344 B2 2/2014 Wang et al.
8,715,919 B2 5/2014 Chang et al.
8,741,551 B2 6/2014 Wu et al.
9,140,987 B2 9/2015 Chien et al.
(Continued)

OTHER PUBLICATIONS

U.S. Appl. No. 14/841,173, filed Aug. 31, 2015.

*Primary Examiner* — Steven B McAllister
*Assistant Examiner* — Benjamin W Johnson
(74) *Attorney, Agent, or Firm* — McClure, Qualey & Rodack, LLP

(57) ABSTRACT

A furnace for processing semiconductor wafers is provided. The furnace includes a tube having a closed upper end, an open lower end, and a sidewall connecting the upper end and the lower end. The furnace further includes a sealing lid removably connected to the lower end of the tube to define a reaction chamber. The furnace also includes an insulation cap connected to the sealing lid and positioned in the reaction chamber, and an opening is formed on a top surface of the insulation cap. In addition, the furnace includes a block member covering the opening and a wafer boat positioned on the top surface of the insulation cap.

20 Claims, 7 Drawing Sheets

(56) References Cited

U.S. PATENT DOCUMENTS

| | | | | |
|---|---|---|---|---|
| 9,184,054 | B1 | 11/2015 | Huang et al. | |
| 2004/0065261 | A1* | 4/2004 | Chen | C23C 16/4412 118/728 |
| 2008/0199818 | A1* | 8/2008 | Nitadori | F27B 17/0025 432/6 |
| 2013/0323641 | A1 | 12/2013 | Chang | |
| 2014/0011133 | A1 | 1/2014 | Liu et al. | |
| 2014/0017615 | A1 | 1/2014 | Chang | |
| 2014/0017616 | A1 | 1/2014 | Chang | |
| 2014/0065843 | A1 | 3/2014 | Chang et al. | |
| 2014/0117563 | A1 | 5/2014 | Yu et al. | |
| 2014/0120459 | A1 | 5/2014 | Liu et al. | |
| 2014/0186773 | A1 | 7/2014 | Chang | |
| 2014/0255850 | A1 | 9/2014 | Chang et al. | |
| 2014/0272709 | A1 | 9/2014 | Liu et al. | |
| 2014/0272726 | A1 | 9/2014 | Chang | |
| 2014/0273521 | A1 | 9/2014 | Wu et al. | |
| 2015/0162280 | A1 | 6/2015 | Pan et al. | |
| 2015/0179511 | A1 | 6/2015 | Hsieh et al. | |
| 2016/0064239 | A1 | 3/2016 | Shih et al. | |

* cited by examiner

1000 provide a reaction chamber with an insulation cap for supporting a wafer boat, wherein the insulation cap is covered by a blocking member — S1 place wafers on the wafer boat — S2 insert the wafer boat into the reaction chamber — S3 supply a process gas into the reaction chamber — S4

FIG. 4

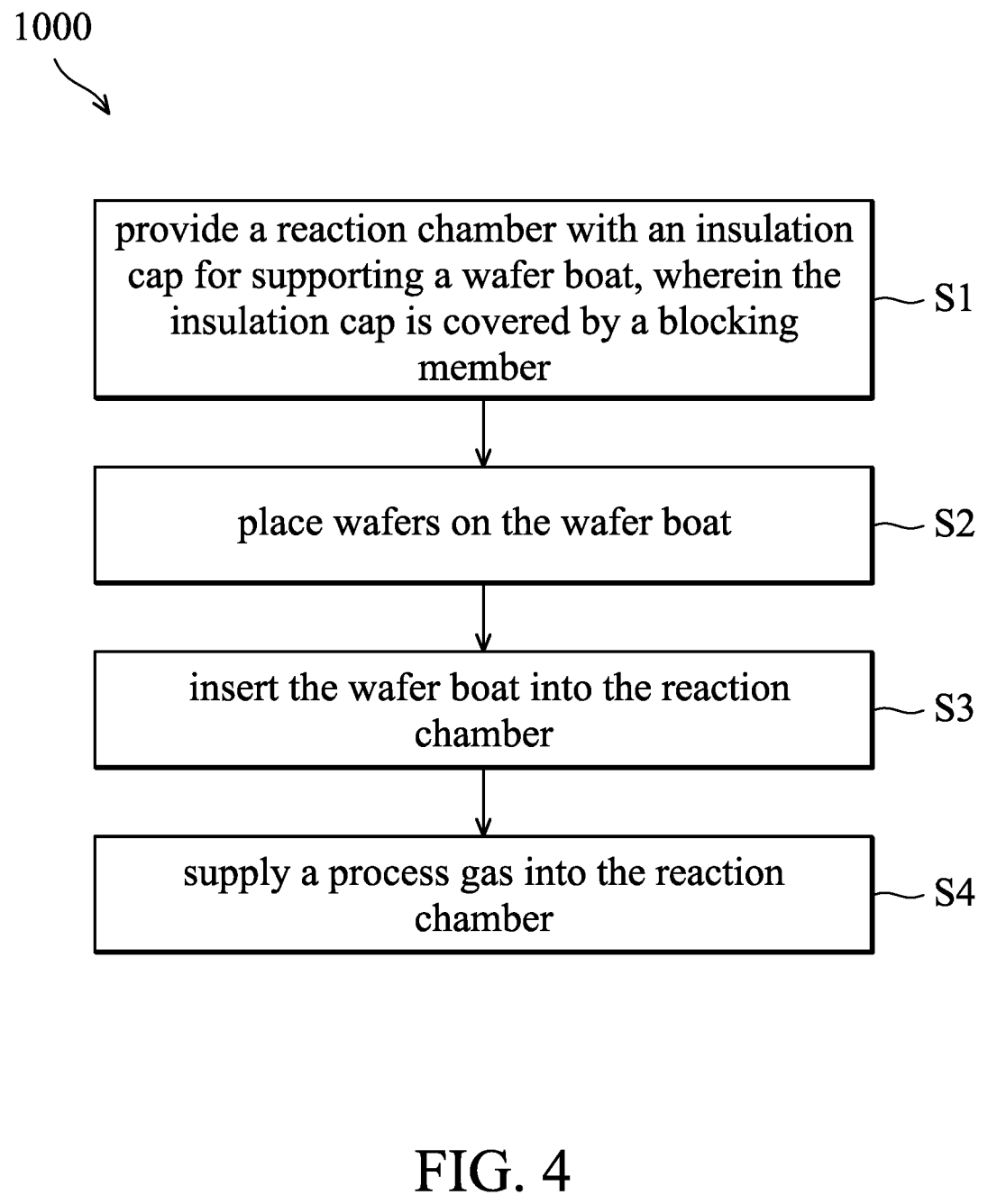

METHOD FOR CONTROLLING TEMPERATURE OF FURNACE IN SEMICONDUCTOR FABRICATION PROCESS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon and form integrated circuits. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

Some processing steps used in fabricating semiconductors include oxidation, diffusion, doping, annealing, and chemical vapor deposition (CVD). The formation of silicon oxide on a silicon substrate is a frequently conducted process in the fabrication of semiconductor devices. One of the methods for forming silicon oxide is thermal oxidization which is carried out by subjecting a silicon wafer to an oxidizing ambient at elevated temperatures. The uniformity of the silicon oxide deposited on the wafer is affected and controlled by regulating process parameters such temperature of the wafer, reaction chamber pressure, flow path and rate of reactant gases, and process time or duration.

Although existing devices and methods for forming of silicon oxide on the silicon substrate on the wafer have been generally adequate for their intended purposes, they have not been entirely satisfactory in all respects. Consequently, it would be desirable to provide a solution for forming the silicon oxide for use in a wafer process apparatus.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 4 is a flow chart illustrating a method 1000 for processing wafers in a furnace 10, in accordance with some embodiments.

DETAILED DESCRIPTION

Figure 1:
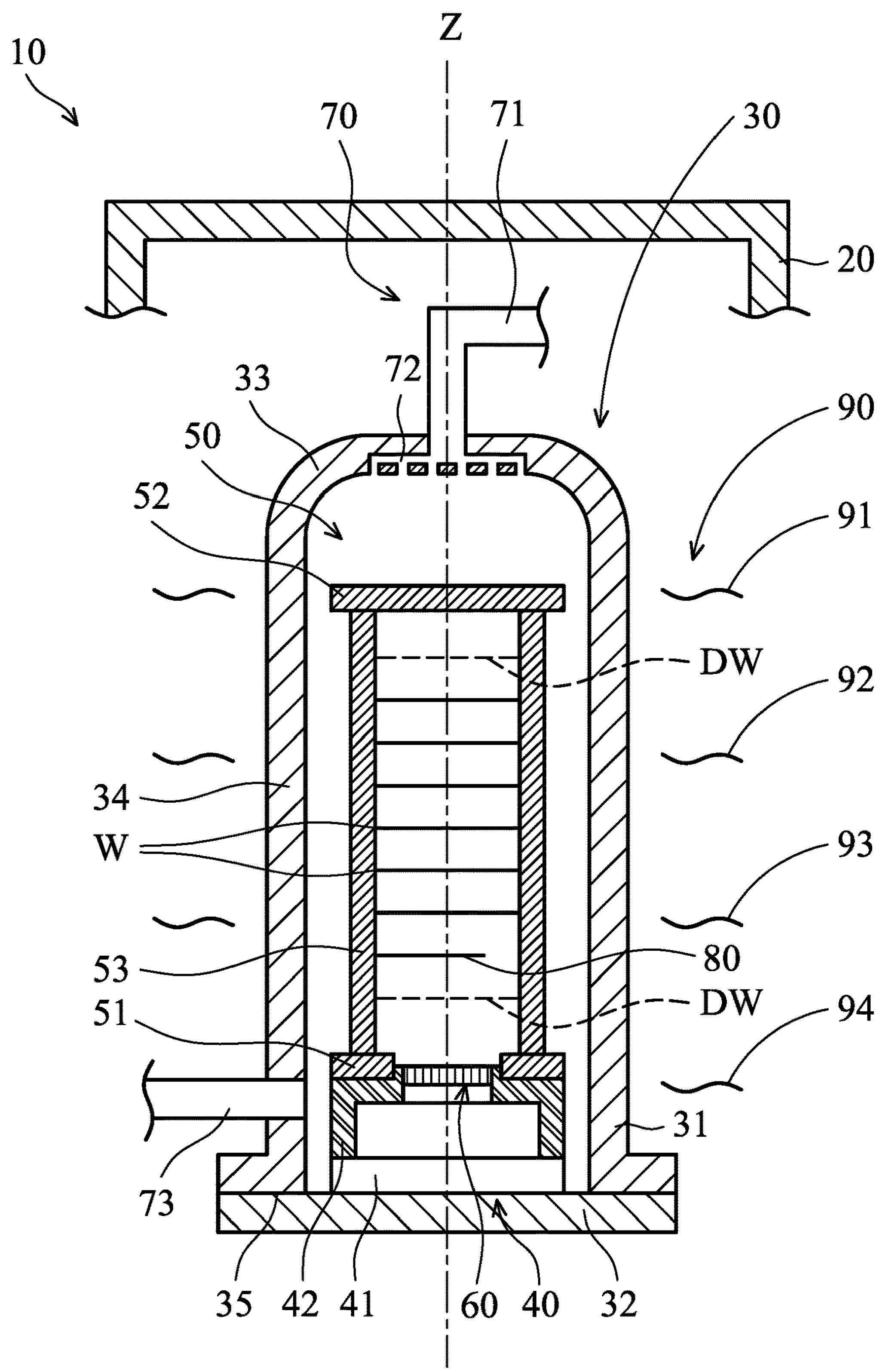
FIG. 1 shows a schematic diagram of one embodiment of a furnace 10 for processing a semiconductor wafer W, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The wafer oxidation rates are proportional to the processing temperature. Accordingly, precise control of process temperatures within a reaction chamber to the maximum extent possible is desirable to minimize variations in oxidation layer thicknesses on an individual wafer and on a wafer-to-wafer basis. Optimally, uniform oxidation layer thickness is required so that all dies fabricated on each wafer and all dies in the batch from wafer-to-wafer possess the same mechanical, electrical, and reliability properties. If the variations in oxidation layer thicknesses become too great, subsequent semiconductor processing steps as well as the final die integrity may be adversely affected as the dies undergo layer-by-layer fabrication through a series of further material deposition and removal steps. In addition, die failure rates may increase in subsequent wafer level and known good die testing.

Embodiments described below provide multiple solutions to improve uniformity in temperature for maintaining the desired consistency in both oxidation layer thicknesses deposited over the entire surface of each individual wafer, and from wafer-to-wafer throughout the entire batch or stack of wafers being processed.

FIG. 1 shows a schematic diagram of one embodiment of a furnace 10 for processing a semiconductor wafer W in accordance with some embodiments. In some embodiments, the furnace 10 includes an insulated housing 20 (partially shown in FIG. 1), a reaction chamber 30, an insulation cap 40, a wafer boat 50, a block member 60, a gas supplying unit 70, one or more truncated plates 80, one or more dummy wafers DW, and a number of heating units 90. The elements of the furnace 10 can be added to or omitted, and the invention should not be limited by the embodiment.

In accordance with some embodiments, the insulated housing 20 is configured and adapted to provide a thermal enclosure around the reaction chamber 30 to establish a temperature controlled environment for the reaction chamber 30. The reaction chamber 30 includes a tube 31 and a sealing lid 32. The tube 31 extends a height in its longitudinal axis Z and has an upper end 33, a sidewall 34, and a lower end 35.

The upper end 33 is closed, and the lower end 35 is open to allow the wafer boat 50 to be inserted and removed from the reaction chamber 30 for batch processing of wafers W. The upper end 33 and the lower end 35 are located at two opposite sides of the tube 31 and arranged along the longitudinal axis Z. The side wall 34 connects the upper end 33 to the lower end 35. In one embodiment, the lower end 35 may be provided with a flange as shown in FIG. 1 for receiving the sealing lid 32.

The reaction chamber 30 may have a cylindrical shape in one embodiment and may be made of quartz or any other suitable material, like SiC for example, but without limitation. The reaction chamber 30 may include a coating such as polysilicon or another coating material typically used depending on the type of process conducted in the chamber. The reaction chamber 30 may have any suitable height or length depending on the number of wafers to be processed in each batch. In some exemplary embodiments, the reaction chamber 30 may have a representative vertical height or length of 100-150 cm; however, any suitable height or length may be provided.

The insulation cap 40 is configured to minimize the heat lost via the sealing lid 32. In some embodiments, the insulation cap 40 is positioned in a lower site of the reaction chamber 30 that is approximate to the lower end 35 and includes a quartz base 41 and a supporting frame 42. The quartz base 41 may be fixed on the inner surface of the insulation cap 40 that faces the interior of the reaction chamber 30. The supporting frame 42 is positioned over the quartz base 41 for supporting the wafer boat 50.

In some embodiments, the supporting frame 42 includes a lateral frame member 43 and a top frame member 44. The lateral frame member 43 is fixed on the quartz base 41 and extends in a direction that is away from the sealing lid 32 and parallel to the longitudinal axis of the tube 31. The top frame member 44 is connected to the distal end of the lateral frame member 43 and extends parallel to the sealing lid 32.

The supporting frame 42 may be made of suitable material, like SiC or quartz for example, but without limitation. The lateral frame member 43 and the top frame member 44 may be fabricated integrally, and the lateral frame member 43 and the top frame member 44 may have the same thickness. The top frame member 44 is described in more detail in the description of FIG. 2A.

The wafer boat 50 is adapted for supporting and holding a plurality of vertically-stacked wafers W and allowing reactant gas to flow horizontally over the face of the wafers W to build the desired oxidation layer thicknesses thereon. In some embodiments, the wafer boat 50 is positioned over the insulation cap 40 and includes a bottom plate 51, a top plate 52 and a number of columns 53.

The bottom plate 51 and the top plate 52 are arranged to face each other. The columns 53 connect the bottom plate 51 to the top plate 52. Each of the columns 53 has grooves (not shown) for directly holding the wafers W to be placed in multiple stages or for holding ring-shaped support plates on which the wafers W are to be placed in multiple stages.

Typical vertical spacing of wafers W in wafer boat 50 may be about 6-10 mm apart in some embodiments. The wafer boat 50 may be sized to hold 50-125 wafers W or more in some embodiments; however, any suitable number of wafers may be held by the wafer boat depending on the height of the reaction chamber 30 provided. The wafer boat 50 may be made of quartz, SiC, Si or any other suitable material commonly used in the art.

Figure 2A:
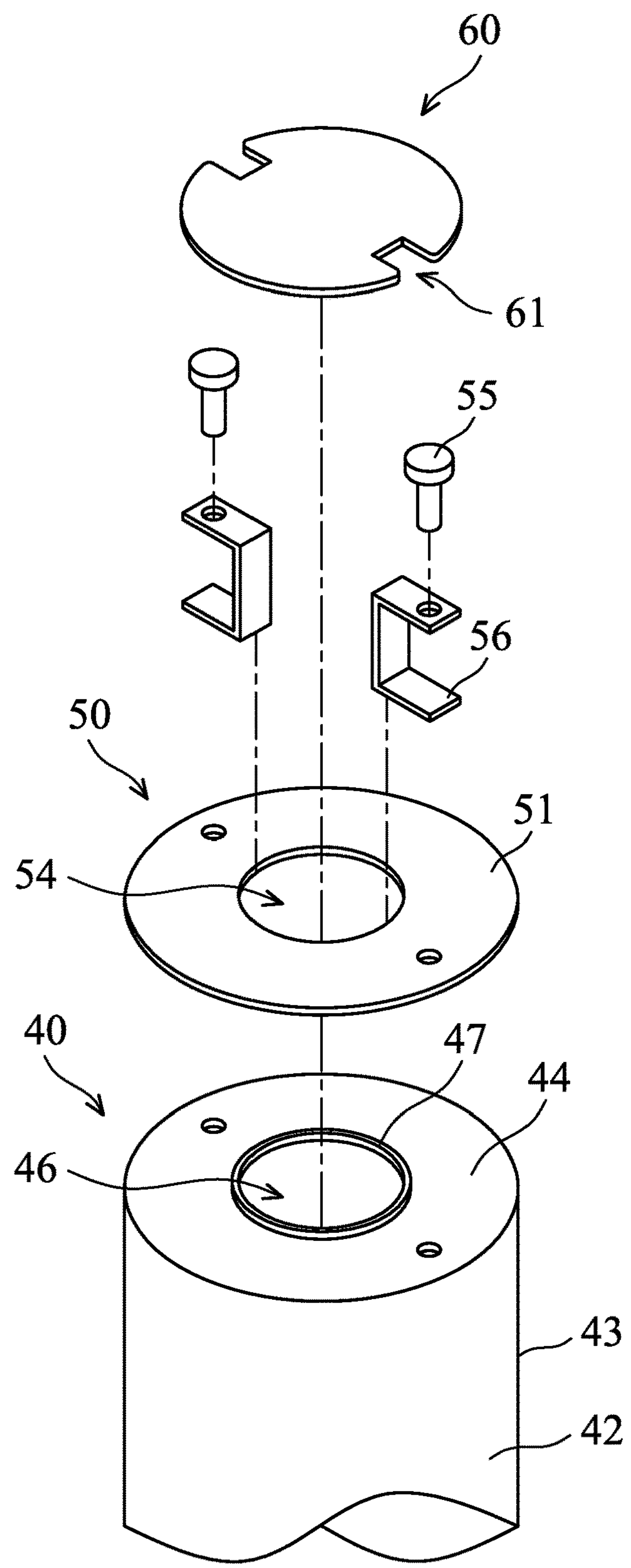
FIG. 2A shows an exploded view of the wafer boat connecting to the supporting frame with a block member, in accordance with some embodiments.

FIG. 2A shows an exploded view of the wafer boat 50 (partially shown in FIG. 2A) connecting to the supporting frame 42 with a block member 60. In some embodiments, an opening 46 with a circular shape is formed on a top surface of the top frame member 44, and a projection 47 projects from the edge of the opening 46 in a direction away from the sealing lid 32. In addition, the bottom plate 51 has an oval shape, and a circular through hole 54 is formed on the bottom plate 51. The diameter of the through hole 54 may be slightly greater than the outer diameter of the projection 47. As a result, the projection 47 allows the bottom plate 51 to be quickly positioned on the top frame member 44 during the assembly of the wafer boat 50 to the insulation cap 40.

The wafer boat 50 may be fixed on the insulation cap 40 by any suitable method. For example, the wafer boat 50 may be fixed on the insulation cap 40 via two fastening members 55. The two fastening members 55, such as screws, pass through the the bottom plate 51 and the top frame member 44 to fix the bottom plate 51 on the top frame member 44; however, any suitable number of fastening members may be used.

In some embodiments, in addition to the fastening member 55, one or more clamping members 56 are utilized to avoid movement of the wafer boat 50 relative to the insulation cap 40. For example, two clamping members 56 are positioned on the edges of the through hole 54 and the opening 46 so as to hold the bottom plate 51 and the top frame member 44. Each clamping member 56 may be U-shaped and extend a particular length toward the center of the through hole or the opening. With the clamping member 56, the wafer boat 50 is stably connected to the insulation cap 40 and not inclined even if an earthquake occurs. In some embodiments, the clamping members 56 are omitted.

The block member 60 is configured to cover the opening 46 to avoid gas flowing into the insulation cap 40 and to minimize the heat lost via the insulation cap 40. In some embodiments, the block member 60 is inserted into the opening 46 and covers the opening 46. The block member 60 may be connected to the opening 46 in a tight-fitting manner, and a gap is defined between the block member 60 and the edge of the opening 46 in a direction that is perpendicular to the longitudinal axis Z so as to accommodate thermal expansion. However, it should be appreciated that many variations and modifications can be made to embodiments of the disclosure.

In some other embodiments, the block member 60 is disposed above the top frame member 44 and covers the opening 46. The block member 60 is connected to the projection 47 and is not inserted into the opening 46. A gap is defined between the block member 60 and the projection 47 in a direction that is parallel to the longitudinal axis Z. In yet some other embodiments, the block member 60 is disposed beneath the top frame member 44 and covers the opening 46. The block member 60 is connected to the bottom surface of the top frame member 44 and is not inserted into the opening 46. A gap is defined between the block member 60 and the projection 47 in a direction that is parallel to the longitudinal axis Z.

Figure 2B:
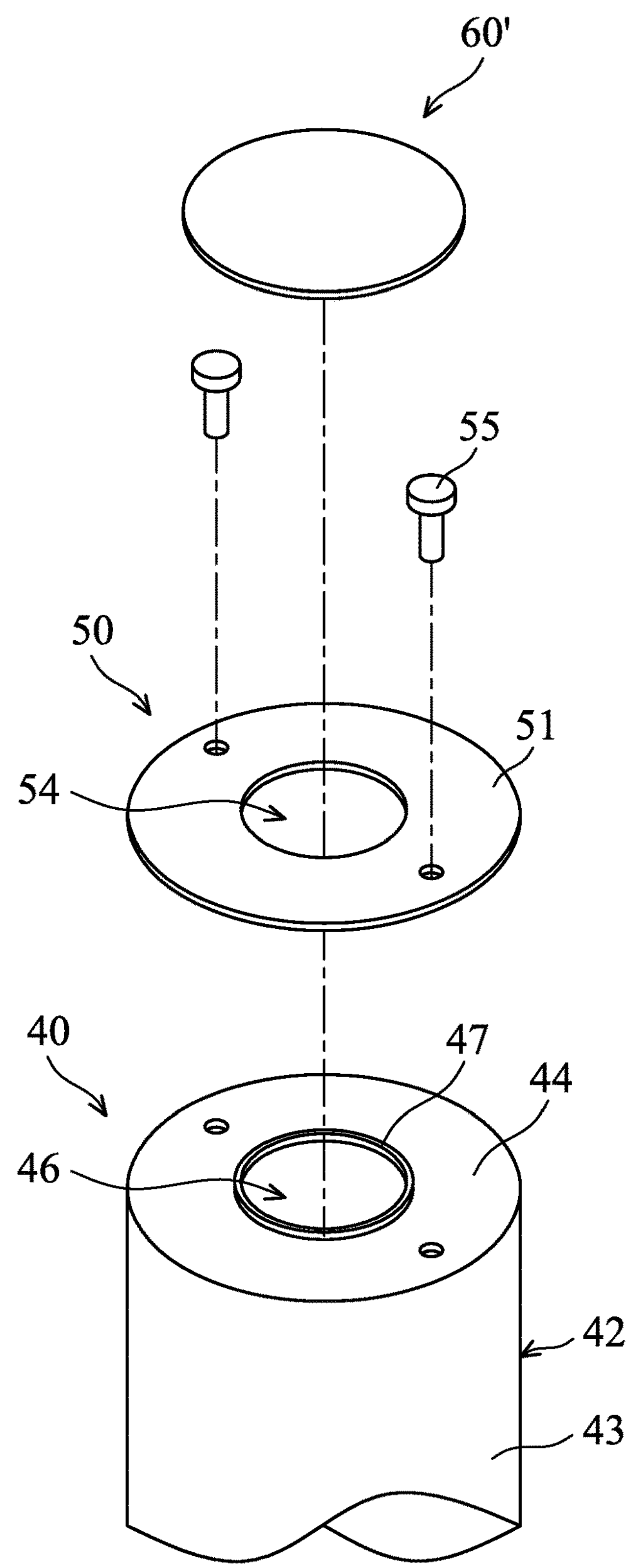
FIG. 2B shows an exploded view of the wafer boat connecting to the supporting frame with a round-shape block member, in accordance with some embodiments.

The block member 60 may be made of suitable material, like SiC for example, but without limitation. The shape of the block member 60 may be compatible with the shape of the opening 46. In cases where the clamping members 56 are used to hold the wafer boat 50 and supporting frame 42, the block member 60 has two notches 61 arranged relative to the clamping members 56 for receiving the clamping members 56 therein, as shown in FIG. 2A. However, it should be appreciated that many variations and modifications can be made to embodiments of the disclosure. In some other embodiments, as shown in FIG. 2B, the block member 60 has a round shape.

Referring to FIG. 1, the gas supplying unit 70 is configured to control the supply of the processing gas into the reaction chamber 30. In some embodiments, the gas supplying unit 70 includes a gas inlet 71, a showerhead 72, and a gas exhaust 73. The gas inlet 71 is connected to the upper end 33 of the reaction chamber 30. A gas controller (not shown in figures) may be connected to the gas inlet 71 and be configured to control the connection and delivery rate of the processing gas to the reaction chamber 30. The gas controller may include devices such as valves, flow meters, sensors, and the like. The gas inlet 71 may include three nozzles for delivering the process gas.

The showerhead 72 is configured to receive the gas from the gas inlet 71 and disperse the gas in a thin and even distribution around the reaction chamber 30. The showerhead 72 may have openings dispersed evenly around the upper end 33. The gas exhaust 73 is configured to remove the process gas in the reaction chamber 30 to a gas handling system (not shown in figures) of a foundry. The gas exhaust 73 may be connected to the lower site of the side wall 32 that is adjacent to the lower end 35.

The truncated plate 80 is configured to redirect the flow of the process gas in the reaction chamber 30. In some embodiments, a number of truncated plates 80 are consecutively held by the wafer boat 50 (only one truncated plate 80 is shown in FIG. 1). It is appreciated that any suitable number of truncated plates 80 may be held by the wafer boat 50. For example, two or four truncated plates 80 which are immediately adjacent to each other are held by the wafer boat 50. In some embodiments, the truncated plates 80 are positioned at a zone of the wafer boat 50 that is adjacent to the bottom plate 51, and the truncated plates 80 are positioned between the last wafer W (i.e., the wafer W closest to the supporting frame 42) and the supporting frame 42.

Figure 3:
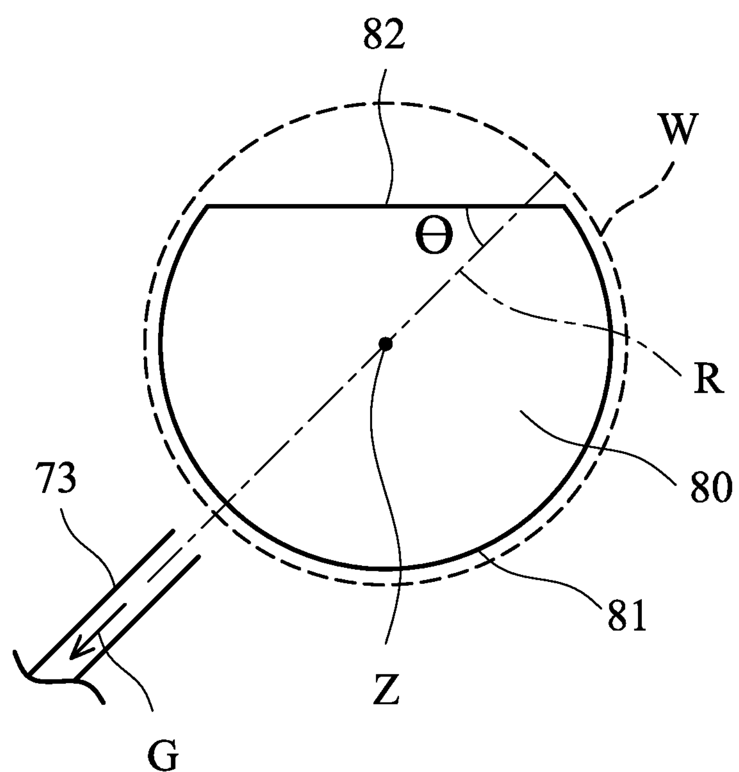
FIG. 3 shows a top view of the truncated plates 80 in relation to the gas exhaust 73 and wafer W.

FIG. 3 shows a top view of the truncated plates 80 in relation to the gas exhaust 73 and wafer W. It should be noted that the wafer W shown in FIG. 3 is indicated as a dotted line and has an exaggerated width for purpose of illustration. In some embodiments, the outer boundary of the truncated plates 80 is defined by a curved boundary 81 and a flat boundary 82. Two ends of the flat boundary 82 are connected to two respective ends of the curved boundary 81. Each truncated plate 80 may have a maximum width that is the same as the diameter of the wafer W, and the length of the flat boundary 82 may be smaller than the diameter of the wafer W.

In some embodiments, the curved boundary 81 is positioned closer to the gas exhaust 73 than the flat boundary 82. As a result, in a top view, an intersection of a flat boundary 82 of the truncated plate 80 and a reference line R which passes through the gas exhaust 73 and the longitudinal axis Z is farther away from the gas exhaust 73 than the longitudinal axis Z. The reference line R forms an angle θ with respect to the truncated plate 80. In some embodiments, the angle θ is about 90 degrees. In some embodiments, the angle θ is smaller than 90 degrees.

With continued reference to FIG. 1, a number of dummy wafers DW are positioned at each end of the wafer boat 50 to enhance process uniformity. Any suitable number of dummy wafers DW may be held by the wafer boat. In some embodiments, two groups of dummy wafers DW are positioned over and under the batch zones at which the semiconductor wafers W are inserted. The dummy wafers DW positioned under the batch zones may be positioned below or over the truncated plates 80.

the heating unit 90 is arranged along the sidewall 34 of the reaction chamber 30. In some embodiments, the heating unit 90 includes four sidewall heaters 91, 92, 93 and 94 provided along the sidewall 34 of the reaction chamber 30. In some embodiments, the sidewall heaters 91, 92, 93 and 94 may be approximately evenly distributed along the vertical height of the reaction chamber.

In some embodiments, the sidewall heaters 91, 92, 93 and 94 are electric resistance type heaters having controllable heat output which may be regulated by adjusting the energy input to each heater via an electrical control device. The heat output from sidewall heaters 91, 92, 93 and 94 may be fine-tuned to adjust the temperature in respective heater zone.

FIG. 4 is a flow chart illustrating a method 1000 for processing wafers in a furnace 10, in accordance with some embodiments. For illustration, the flow chart will be described along with the drawings shown in FIGS. 1-3. Some of the described stages can be replaced or eliminated in different embodiments. Additional features can be added to the semiconductor device structure. Some of the features described below can be replaced or eliminated in different embodiments.

The method 1000 begins with operation S1, in which a furnace, such as furnace 10 is provided. In some embodiments, the furnace 10 is operable in an idle mode and a process mode. In the idle mode, the reaction chamber 30 is open. The sealing lid 32 is separated from the tube 31, and the insulation cap 40 and the wafer boat 50 are moved outside the cavity defined by the tube 31. In the process mode, the reaction chamber 30 is closed. The sealing lid 32 is connected to the tube 31, and the insulation cap 40 and the wafer boat 50 are positioned inside the tube 31.

The method 1000 continues with operation S2 in which a number of wafers W are placed on the wafer boat 50. The wafers W may be moved into the wafer boat 50 by a robot arm (not shown in figures) with a blade.

The wafer W may be made of silicon or other semiconductor materials. Alternatively or additionally, the wafer W may include other elementary semiconductor materials such as germanium (Ge). In some embodiments, the wafer W is made of a compound semiconductor such as silicon carbide (SiC), gallium arsenic (GaAs), indium arsenide (InAs), or indium phosphide (InP). In some embodiments, the wafer W is made of an alloy semiconductor such as silicon germanium (SiGe), silicon germanium carbide (SiGeC), gallium arsenic phosphide (GaAsP), or gallium indium phosphide (GaInP). In some embodiments, the wafer W includes an epitaxial layer. For example, the wafer W has an epitaxial layer overlying a bulk semiconductor. In some other embodiments, the wafer W may be a silicon-on-insulator (SOI) or a germanium-on-insulator (GOI) substrate.

The wafer W may have various device elements. Examples of device elements that are formed in the wafer W include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, in addition to the wafers W, one or more truncated plates 80 (e.g., three truncated plates 80 as shown in FIG. 3) and dummy wafer DW are also held by the wafer boat 50 and transferred into the reaction chamber 30. The truncated plates 80 are positioned at a zone of the wafer boat 50 that is adjacent to the bottom plate 51, and the truncated plates 80 are positioned between the last wafer W (i.e., the wafer W closest to the supporting frame 20) and the supporting frame 20.

In case where multiple truncated plates 80 are placed into the wafer boat 50, the flat boundary 82 of each truncated plate 80 may form a different angle with the reference line R (FIG. 3). For example, three truncated plates 80 are placed in the wafer boat 50. The flat boundary of the uppermost truncated plate 80 forms an angle of 80 degrees with the reference line R, and the flat boundary of the middle truncated plate 80 forms an angle of 85 degrees with the reference line R, and the flat boundary of the lowermost truncated plate 80 forms an angle of 90 degrees with the reference line R. Moreover, the area of the truncated plates 80 may increase gradually in a direction away from the gas inlet 71.

The method 1000 continues with operation S3, in which the wafer boat 50 is inserted into the reaction chamber 30. The wafer boat 50 may be loaded in the tube 31 by lifting up the sealing lid 32 by means of the lifting mechanism (not shown in figures). When the sealing lid 32 is connected to the lower end 35 of the tube 31, the wafer boat **50*a* is located in a gas-tight reaction chamber 30**.

The method 1000 continues with operation S4 in which process gas G is supplied from the gas inlet 71 via the showerhead 72 into the reaction chamber 30, and the process gas G. In some embodiments, the process gas G is used for growing thermal oxides on the wafers W. The process gas G may be dry oxygen, water vapor or Trans-LC ($C_2H_2Cl_2$). In a dry oxygen reaction, the silicon oxide is formed by $Si+O_2 \rightarrow SiO_2$. In a wet oxygen reaction, the silicon oxide is formed by $Si+2H_2O \rightarrow SiO_2+2H_2$. In both cases, silicon is consumed and converted into silicon dioxide. The wafers are held at the elevated temperature for a specific length of time and then brought back to a low temperature in a ramp-down process. In the dry oxidation process, oxygen may be mixed with an inert carrier gas such as nitrogen is passed over the wafers W that are held at an elevated temperature.

The method 1000 continues with operation S3 in which the reaction chamber 30 is heated by the heating unit 90. In some embodiments, the heat output from each sidewall heaters 91, 92, 93 and 94 is adjustable independent of the other sidewall heaters. The heat output setting of each sidewall heater may be adjusted either manually by a user or controlled automatically via a heater controller or computer in conjunction with control signals generated by temperature sensors disposed in the furnace 10 and/or based on predetermined heater temperature output settings derived from experience and empirical data correlated with the size of wafer being processed. A suitable temperature controller may be used to regulate the heat output from the furnace heating system including temperature ramp up and ramp down rates. In some embodiments, the heat output from the sidewall heaters 91, 92, 93 and 94 are gradually decreased, and difference in heat output between the neighboring heaters is within 10 degrees Celsius.

Figure 5:
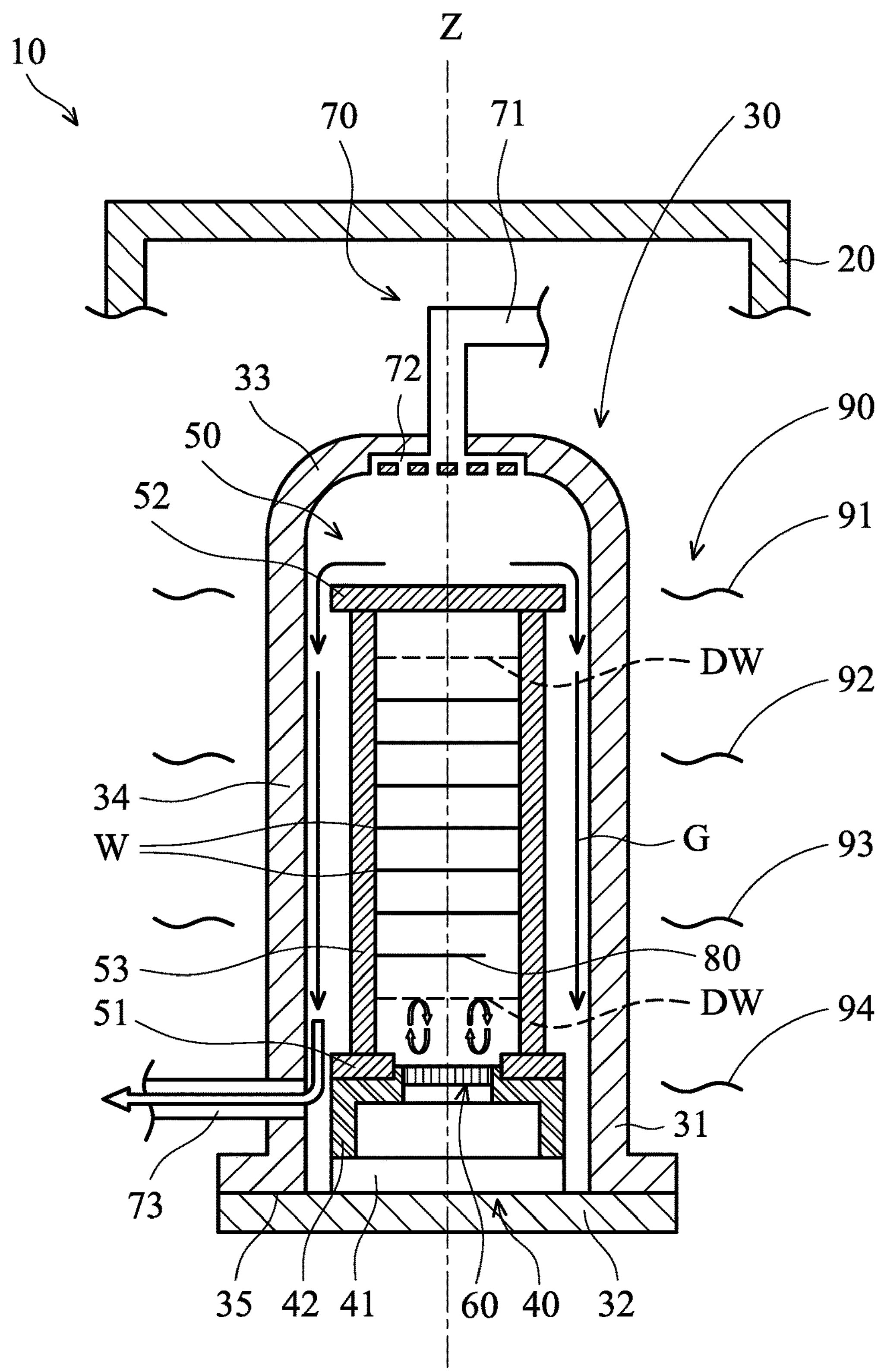
FIG. 5 shows a schematic view of a stage of a method for supplying a process gas G onto the wafer W, in accordance with some embodiments.

FIG. 5 shows a schematic view of a stage of a method for supplying a process gas G onto the wafer W, in accordance with some embodiments. In some embodiments, when the process gas G is introduced into the reaction chamber 30 the process gas G flows along the longitudinal axis Z from the upper end 33 to the lower end 35. It should be noted that since the opening 46 of the insulation cap 40 is covered by the block member 60, when the process gas G approaches the insulation cap 40, the process gas G is blocked by the block member 60, and no process gas G, or a small amount of process gas G, enters the space defined by the supporting frame 42 where gas having lower temperature is contained. Accordingly, the temperature in the lower site of the reaction chamber 30 is increased.

Vertical temperature variations in the stack of wafers held by the wafer boat cause generally unacceptable variances in layer thickness deposited from wafer-to-wafer in the stack. However, with the arrangement of the block member 60 as shown in FIG. 5, variance in layer thickness is advantageously minimized. In accordance with some embodiments, with the arrangement of the block member 60, the variance in the thickness in the stack of wafers decreases to 2.2%. However, by contrast, in cases where the opening 46 is not covered by the block member 60, the variance in the thickness in the stack of wafers is greater than 3.2%.

Moreover, since the temperature in the area immediately above the block member 60 is increased, the temperature difference between a center portion of reaction chamber 30 (coinciding with the center of each wafer W when positioned in the chamber) and an edge or side portion of reaction chamber 30 (coinciding with the outer peripheral edge region of each wafer) is advantageously minimized. Thus, the variance in thickness on each individual wafer that is closer to the insulation cap 40 is decreased. In accordance with some embodiments, with the arrangement of the block member 60, the variance in thickness on each individual wafer decreases to 1.7-2.07%. However, by contrast, in cases where the opening 46 is not covered by the block member 60, the variance in the thickness on each individual wafer is greater than 3%.

In some embodiments, since heat loss is minimized, the temperature of the processing gas G in the lower site of the reaction chamber is able to be kept in a desired range, and even less heat is applied to the lower site of the reaction chamber. Therefore, the heat output of the sidewall heater 94 that is arranged adjacent to the lower end 35 is smaller than the heat output of the sidewall heater 91 that is arranged adjacent to the upper end 33.

Figure 6:
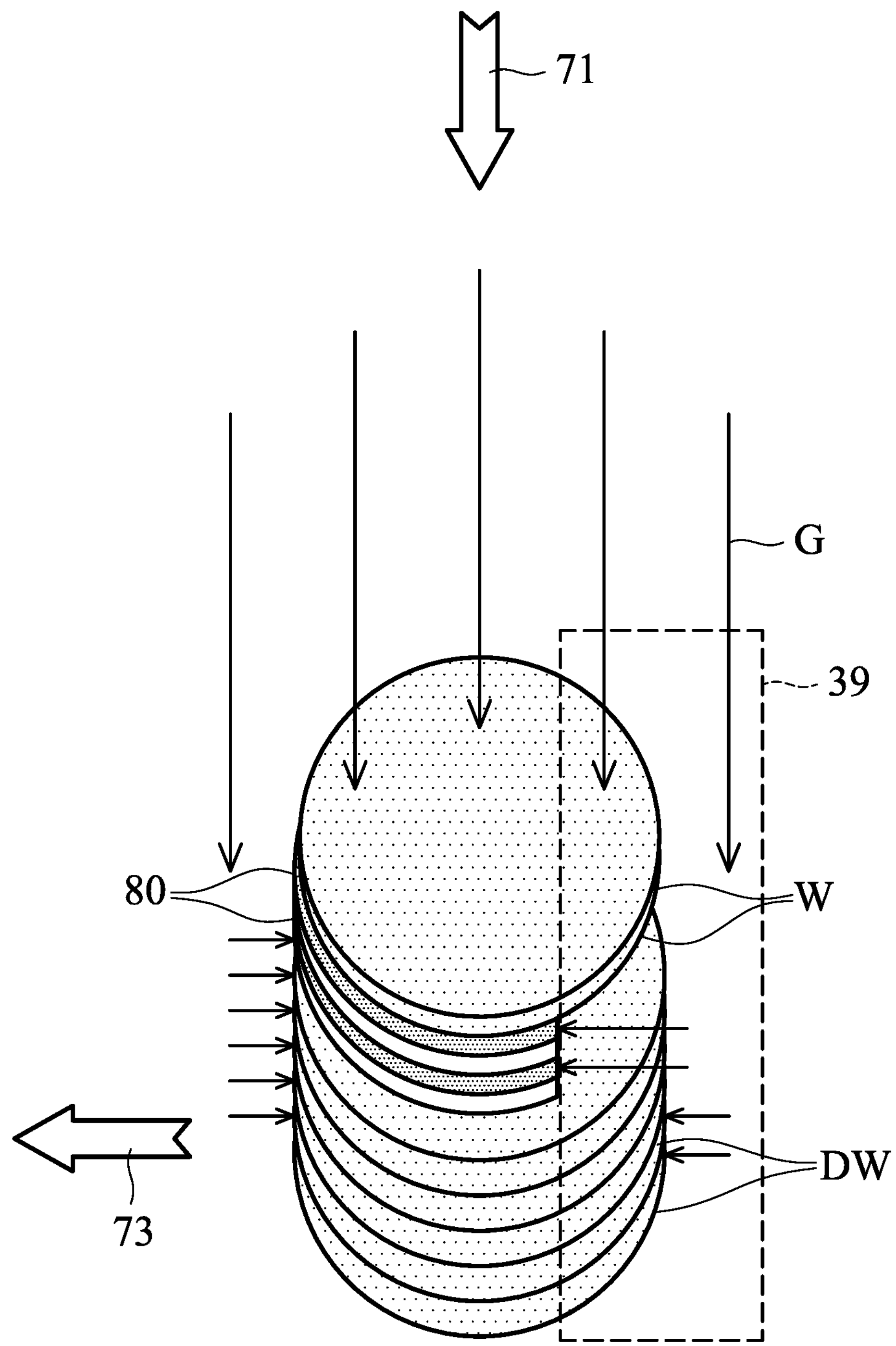
FIG. 6 shows a schematic view of a stage of a method for supplying a process gas onto the wafer by the directing of the truncated plate, in accordance with some embodiments.

FIG. 6 shows a schematic view of a stage of a method for supplying a thermal current G onto the wafer W by the directing of the truncated plate 80, in accordance with some embodiments. In cases where a truncated plate 80 is being placed below the wafer W, because the heat around a region of the wafer W in a remote area 39 of the reaction chamber 30 that is away from the gas exhaust 73 is not isolated by the truncated plate 80, the thermal current G passes through the remote area 39 in a relative short time, and the time period of the thermal current flowing in traversal direction is also reduced. Accordingly, the temperature of the wafer W in remote area 39 of the reaction chamber 30 is decreased. Since the temperature difference in the reaction chamber 30 is minimized, the variance in thickness on each individual wafer is decreased accordingly. In accordance with some embodiments, with the arrangement of the block member 60 and the truncated plate 80, the variance in the thickness on each individual wafer decreases to 0.95-1.23%.

Embodiments of controlling temperature of furnace in semiconductor fabrication process are provided. The supporting frame for supporting the wafer boat is covered with a block member, and thus the heat loss in the lower site of the reaction chamber is minimized. In addition, the process gas is directed into the remote portion of the reaction chamber that is away from the gas exhaust, and the temperature in the remote portion is decreased. As a result, a better temperature uniformity and corresponding uniformity in wafer level thicknesses both on each wafer W (e.g. from the center of the wafer to the edges thereof) and from wafer-to-wafer in the vertical stack of wafers W supported by the wafer boat are improved.

In accordance with some embodiments a furnace for processing a wafer is provided. The furnace includes a tube having a closed upper end, an open lower end, and a sidewall connecting the upper end and the lower end. The furnace also includes a sealing lid removably connected to the lower end of the tube to define a reaction chamber. The furnace further includes an insulation cap connected to the sealing lid and positioned in the reaction chamber, wherein an opening is formed on a top surface of the insulation cap. Moreover, the furnace includes a block member and a wafer boat. The block member covers the opening, and the wafer boat positioned on the top surface of the insulation cap.

In accordance with some embodiments a furnace for processing a wafer is provided. The furnace includes a reaction chamber extending along a longitudinal axis. The furnace further includes a wafer boat and an insulation cap. The wafer boat is positioned in the reaction chamber and holding a plurality of semiconductor wafers. The insulation cap is positioned in the reaction chamber and located below the wafer boat. The furnace also includes a gas inlet and a gas exhaust. The gas inlet is connected to an upper site of the reaction chamber that is above the wafer boat, and the gas exhaust is connected to a lower site of the reaction chamber that is beneath the wafer boat. Moreover, the furnace includes a truncated plate held by the wafer boat and positioned between the semiconductor wafers and the insulation cap. In a top view, an intersection of a flat boundary of the truncated plate and a reference line which passes through the gas exhaust and the longitudinal axis is farther away from the gas exhaust than the longitudinal axis.

In accordance with some embodiments a method for controlling a processing temperature in a semiconductor wafer process is provided. The method includes providing a furnace. The furnace includes a tube, a sealing lid, an insulation cap. The sealing lid is removably connected to the lower end of the tube to define a reaction chamber. The insulation cap is connected to the sealing lid and positioned in the reaction chamber. The furnace further includes a block member covering an opening formed on the insulation cap. The method further includes placing a plurality wafers on a wafer boat positioned on the insulation cap. The method also includes inserting the wafer boat holding a plurality wafers into the reaction chamber. Moreover, the method includes supplying a process gas into the reaction chamber.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A furnace for processing a wafer, comprising:

a tube having a closed upper end, an open lower end, and a sidewall connecting the upper end and the lower end;

a sealing lid removably connected to the lower end of the tube to define a reaction chamber;

an insulation cap connected to the sealing lid and positioned in the reaction chamber, wherein an opening is formed on a top surface of the insulation cap; a block member covering the opening and located in the opening; and a wafer boat positioned on the top surface of the insulation cap, wherein the wafer boat comprises:

a bottom plate positioned on the top surface of the insulation cap and having a through hole aligned with the opening of the insulation cap;

a top plate; and a column connecting the bottom plate and the top plate;

wherein the furnace further comprises:

a clamping member passing through the through hole and the opening and connecting the bottom plate and the insulation cap, wherein the clamping member extends a particular length toward the center of the through hole or the opening, and the block member has a notch arranged relative to the clamping member for receiving the clamping member therein;

and wherein a gas inlet is connected to the tube along a longitudinal axis, and the opening is aligned with the gas inlet along the longitudinal axis.

2. The furnace as claimed in claim 1, wherein the insulation cap comprises a supporting frame configured for supporting the wafer boat, wherein the supporting frame comprises:

a lateral frame member extending away from the sealing lid; and a top frame member connected to the lateral frame member and arranged parallel to the sealing lid, wherein the opening is formed on the top frame member.

3. The furnace as claimed in claim 2, wherein the insulation cap further comprises a quartz base surrounded by the supporting frame.

4. The furnace as claimed in claim 2, wherein the supporting frame of the insulation cap and the block member are made of SiC or quartz.

5. The furnace as claimed in claim 1, wherein there is a gap formed between the block member and the opening in a direction that is perpendicular to a longitudinal direction of the wafer boat.

6. The furnace as claimed in claim 1, wherein the block member has a flat plate shape.

7. The furnace as claimed in claim 1, wherein the wafer boat is arranged immediately adjacent to the opening of the insulation cap.

8. The furnace as claimed in claim 1, wherein the insulation cap is positioned adjacent to a lower end of the tube and extends a height along a longitudinal axis of the wafer boat from the sealing lid, and wherein the top surface of the insulation cap is located away from the sealing lid.

9. The furnace as claimed in claim 1, wherein a space is defined by the insulation cap, and the space is a central space through the insulation cap along the longitudinal axis.

10. A furnace for processing a wafer, comprising:

a reaction chamber extending along a longitudinal axis;

a wafer boat positioned in the reaction chamber and holding a plurality of semiconductor wafers, wherein the wafer boat comprises:

a bottom plate;

a top plate; and a column connecting the bottom plate and the top plate;

wherein the furnace further comprises:

an insulation cap positioned in the reaction chamber and beneath the wafer boat, wherein an opening is formed on the insulation cap, and wherein the bottom plate is positioned on a top surface of the insulation cap and has a through hole aligned with the opening of the insulation cap;

a gas inlet and a gas exhaust connected to the reaction chamber and configured for creating a flow of process gas in the reaction chamber;

a block member positioned relative to the opening, wherein when the flow of process gas approaches the insulation cap, the process gas is blocked by the block member from entering a space defined by the insulation cap, and wherein the space is a central space through the insulation cap along the longitudinal axis; and a clamping member passing through the through hole and the opening and connecting the bottom plate and the insulation cap, wherein the clamping member extends a particular length toward the center of the through hole or the opening, and the block member has a notch arranged relative to the clamping member for receiving the clamping member therein, and wherein a surface of the insulation cap is around the longitudinal axis and is continuous.

11. The furnace as claimed in claim 10, wherein the insulation cap comprises a supporting frame configured for supporting the wafer boat, wherein the supporting frame comprises:

a lateral frame member; and a top frame member connected to the lateral frame member, wherein the opening is formed on the top frame member.

12. The furnace as claimed in claim 11, wherein the insulation cap further comprises a quartz base surrounded by the supporting frame.

13. The furnace as claimed in claim 10, wherein there is a gap formed between the block member and the opening in a direction that is perpendicular to a longitudinal direction of the wafer boat.

14. The furnace as claimed in claim 10, wherein the wafer boat is arranged immediately adjacent to the opening of the insulation cap.

15. The furnace as claimed in claim 10, wherein the insulation cap extends a height along a longitudinal axis of the wafer boat from a sealing lid, and wherein the top surface of the insulation cap is located away from the sealing lid.

16. A furnace for processing a wafer, comprising:

a reaction chamber extending along a longitudinal axis;

a wafer boat positioned in the reaction chamber and holding a plurality of semiconductor wafers and at least one truncated plate, wherein the wafer boat comprises:

a bottom plate;

a top plate; and a column connecting the bottom plate and the top plate;

wherein the furnace further comprises:

an insulation cap positioned in the reaction chamber and beneath the wafer boat, wherein the insulation cap comprises a top frame member on which the wafer boat is placed, and an opening is formed on the top frame member of the insulation cap, wherein a space is defined by the insulation cap, and the space is a central space through the insulation cap along the longitudinal axis, wherein the bottom plate is positioned on the top surface of the insulation cap and has a through hole aligned with the opening of the insulation cap;

a flat plate block member covering the opening of the insulation cap and placed in contact with the top frame member; and a clamping member passing through the through hole and the opening and connecting the bottom plate and the insulation cap, wherein the clamping member extends a particular length toward the center of the through hole or the opening, and the flat plate block member has a notch arranged relative to the clamping member for receiving the clamping member therein; and wherein the reaction chamber is connected to a gas inlet, and the opening is aligned with the gas inlet along the longitudinal axis.

17. The furnace as claimed in claim 16, wherein a surface of the insulation cap is around the longitudinal axis and is continuous.

18. The furnace as claimed in claim 16, wherein the block member is made of SiC or quartz.

19. The furnace as claimed in claim 16, wherein there is a gap formed between the block member and the opening in a direction that is perpendicular to a longitudinal direction of the wafer boat.

20. The furnace as claimed in claim 16, wherein the wafer boat is arranged immediately adjacent to the opening of the insulation cap.

* * * * *